(12) United States Patent
Hishinuma et al.

(10) Patent No.: US 6,787,787 B1
(45) Date of Patent: Sep. 7, 2004

(54) ULTRAVIOLET RADIATION PRODUCING APPARATUS

(75) Inventors: Nobuyuki Hishinuma, Himeji (JP); Hiroshi Sugawara, Himeji (JP); Fumitosho Takemoto, Himeji (JP); Hiroaki Tokai, Himeji (JP); Jun Murase, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/530,955

(22) PCT Filed: Oct. 7, 1999

(86) PCT No.: PCT/JP99/05542

§ 371 (c)(1),
(2), (4) Date: May 16, 2000

(87) PCT Pub. No.: WO01/27984

PCT Pub. Date: Apr. 19, 2001

(51) Int. Cl.[7] .................................. H01L 21/304
(52) U.S. Cl. .................. 250/504 R; 250/493.1; 250/396
(58) Field of Search .................. 250/504 R, 493.1, 250/396, 506, 506.1; 315/46, 49

(56) References Cited

U.S. PATENT DOCUMENTS 5,129,994 A * 7/1992 Ebbing et al. ............ 216/55
5,510,158 A * 4/1996 Hiramoto et al. ........ 427/582
5,763,892 A * 6/1998 Kizaki et al. ........... 250/492.1
6,049,086 A * 4/2000 Foggiato et al. ........ 250/504 R
6,284,050 B1 * 9/2001 Shi et al. ................. 118/715

FOREIGN PATENT DOCUMENTS

| JP | 47-4475 | 2/1947 |
| JP | 62-127469 | 6/1987 |
| JP | 02-058214 | 2/1990 |
| JP | 06-061146 | 3/1994 |
| JP | 08-085861 | 4/1996 |
| JP | 08-153686 | 6/1996 |
| JP | 9-27468 A | 1/1997 |
| JP | 09-027468 A | 1/1997 |
| JP | 9-74079 A | 3/1997 |
| JP | 9-260303 A | 10/1997 |
| JP | 11-295500 A | 10/1999 |

* cited by examiner

*Primary Examiner*—Nikita Wells
*Assistant Examiner*—Anthony Quash
(74) *Attorney, Agent, or Firm*—Nixon Peabody LLP; David S. Safran

(57) ABSTRACT

An ultraviolet illumination equipment including a receptacle with a window, a dielectric-barrier discharge lamp located within the receptacle for emitting ultraviolet radiation through the window, and a heater for heating the window to at least 100° C.

4 Claims, 5 Drawing Sheets

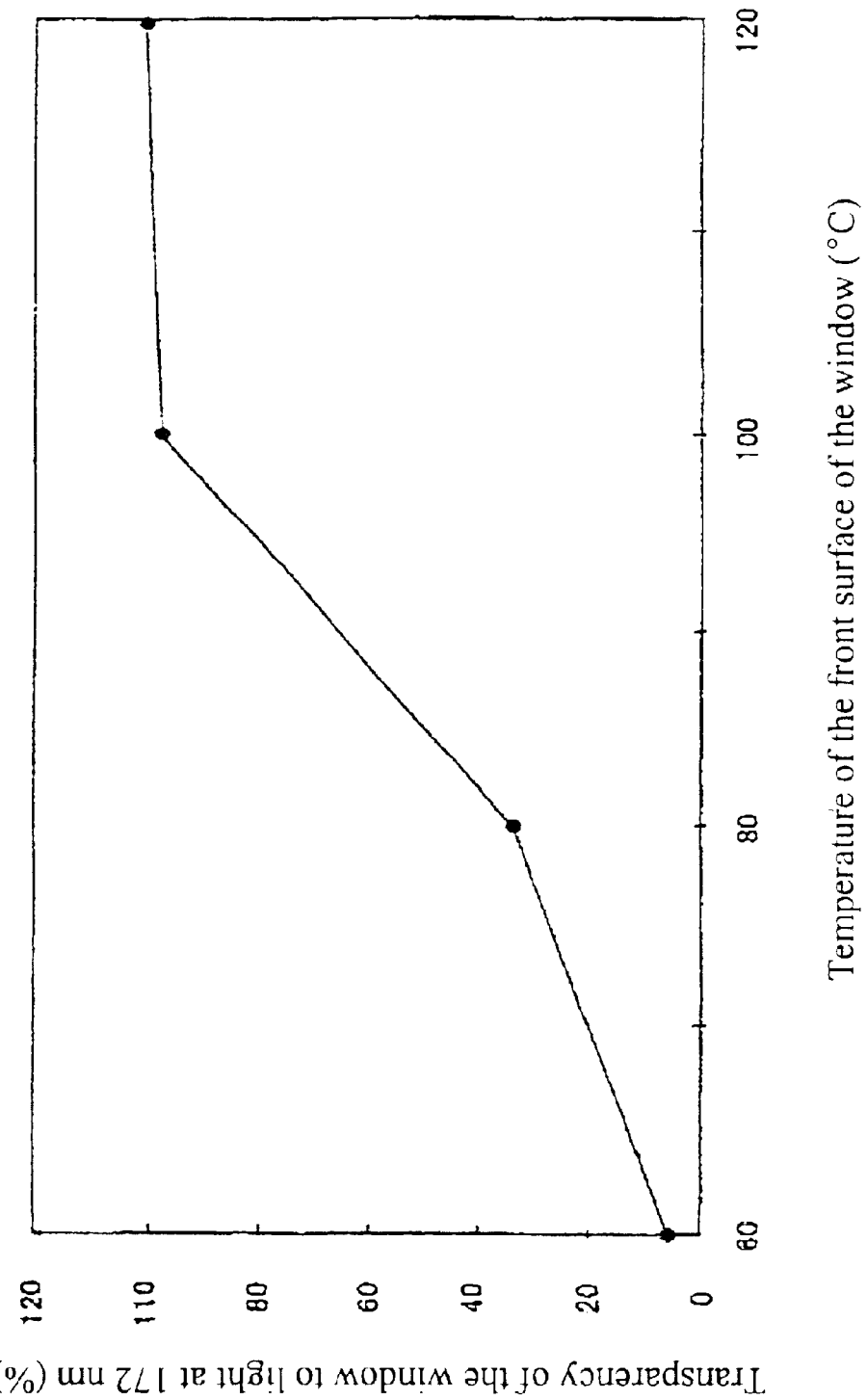

ULTRAVIOLET RADIATION PRODUCING APPARATUS

BACKGROUND OF THE INVENTION

1. Field of the Invention

This invention concerns ultraviolet illumination equipment to for dry washing by ultraviolet radiation from a dielectric-barrier discharge lamp, and by ozone created at the same time by the ultraviolet radiation.

2. Description of the Related Art

Technology for dry washing by means of ultraviolet illumination equipment using an ultraviolet radiation light source has been known for some time. Such ultraviolet illumination equipment has been used for light washing and precision light washing in the liquid crystal and semiconductor field.

Ultraviolet illumination equipment of this type have previously used, as the ultraviolet light source, low-pressure mercury lamps and medium pressure mercury lamps that radiate well at the ultraviolet wavelengths of 253.7 nm or 184.9 nm.

Various chemicals such as organic solvents, acids and alkalis are used when processing semiconductor or liquid crystal devices, and so these chemicals are often removed by evaporation. Among these chemicals are those that absorb ultraviolet radiation and are broken down by the energy and produce reaction products after reacting with other chemicals. For example, ammonium bisulfate $(NH_4)H(SO_4)_2$ and ammonium sulfate $(NH_4)_2SO_4$ are produced.

Such reaction products circulate as fine dust particles within the clean room, and when these fine dust particles accumulate, they sometimes become a factor with a deleterious effect on the manufacturing process.

On the other hand, in recent years, dielectric-barrier discharge lamps with high energy a single wavelength and good efficiency have come to be used, as the ultraviolet illumination equipment in place of the mercury lamps described above.

In ultraviolet illumination equipment that uses a dielectric-barrier discharge lamp as the ultraviolet light source, the dielectric-barrier discharge lamp is placed in a receptacle that is sealed to separate it from the atmosphere, and the ultraviolet radiation emitted by the dielectric-barrier discharge lamp passes through a part of that receptacle to illuminate the item to be processed.

Nevertheless, there has been a problem in that ultraviolet illumination equipment that uses a dielectric-barrier discharge lamp has a window through which the ultraviolet radiation passes, and the reaction products mentioned above are carried by convection and adhere to this window.

The reason the reaction products adhere to the window is that when the dielectric-barrier discharge lamp is lit, the temperature of the front of the lamp is low, about 70° C., and so the radiant heat radiated from the lamp cannot heat the window sufficiently. Because of that, reaction products that come into contact with the window are not carried away from the window by the radiant heat, but immediately adhere to the window.

As a result, there are the problems in that the transparency to ultraviolet radiation is lowered by the reaction products that adhere to the window, and the intensity of the ultraviolet radiation is not uniform throughout the area of illumination.

There is the further in that processing defects and flaws appear on the item being processed, and the yield is reduced.

In cases of a considerable buildup of reaction products adhered to the window, there is a problem in that the reaction products can peel off the window as large pieces of debris, and contaminate the processing environment of the clean room.

SUMMARY OF THE INVENTION

This invention was made on the basis of the situation described above. Its primary purpose is to provide ultraviolet illumination equipment that makes it possible to prevent reaction products due to ultraviolet radiation from adhering to the window, and thus to prevent reduction of the intensity of the ultraviolet radiation and the formation of debris from the reaction products.

In order to resolve the problems described above, the ultraviolet illumination equipment has a dielectric-barrier discharge lamp located within a receptacle, a window in the receptacle through which the ultraviolet radiation from the dielectric-barrier discharge lamp is emitted, and a heating means to heat the window to at least 100° C.

In another embodiment of the ultraviolet illumination equipment in accordance with the present invention, the heating means is established within the ultraviolet illumination equipment.

In another embodiment of the ultraviolet illumination equipment in accordance with the present invention, the heating means is a thick-film heater formed on the surface of the window.

In another embodiment of the ultraviolet illumination equipment in accordance with the present invention, the heating means is a linear beater formed on the surface of the window.

In another embodiment of the ultraviolet illumination equipment in accordance with the present invention, a the heating means is an incandescent bulb.

BRIEF DESCRIPTION OF THE DRAWINGS

FIG. 5 is experimental data showing the change, due to the temperature of the window, in transparency to ultraviolet radiation caused by the adherence of radiation products.

DETAILED DESCRIPTION OF THE INVENTION

Figure 1:
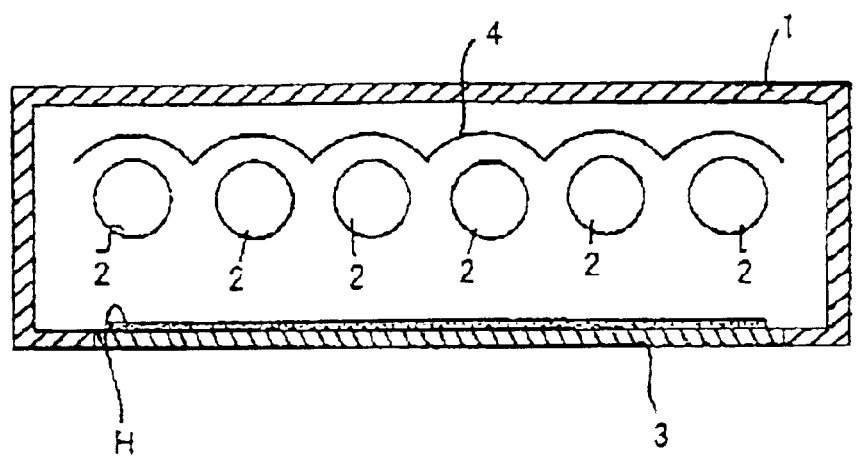
FIG. 1 is an explanatory drawing of the ultraviolet illumination equipment of this invention.

FIG. 1 is an explanatory drawing of the ultraviolet illumination equipment in accordance with one embodiment of this invention.

Within a receptacle 1 made of stainless steel, there are a number of dielectric-barrier discharge lamps 2 that emit ultraviolet radiation. There is a window 3 made of quartz glass to be transparent to ultraviolet radiation on the front of the receptacle 1.

On the inner surface of the window 3 of the ultraviolet illumination equipment is formed a heating means for heating the window 3 to at least 100° C. Now, the heating means H will be explained in detail hereafter.

The receptacle 1 is sealed closed, and the dielectric-barrier discharge lamps 2 are separated from the atmosphere. The receptacle 1 is sealed with a gas, such as nitrogen, argon or neon, whose transparency is inactive with regard to the light emitted by the dielectric-barrier discharge lamps 2.

The dielectric-barrier discharge lamps 2 are filled with xenon at 250 Torr as a discharge gas. The input power is 0.2 W per square centimeter of sight emitting area, and ultraviolet radiation with a maximum wavelength of 172 nm is emitted efficiently.

In FIG. 1, 4 is a reflecting mirror that efficiently reflects the ultraviolet radiation emitted by the dielectric-barrier discharge lamps 2 toward the window.

The heating means H is explained next.

Heating Means 1

Figure 2:
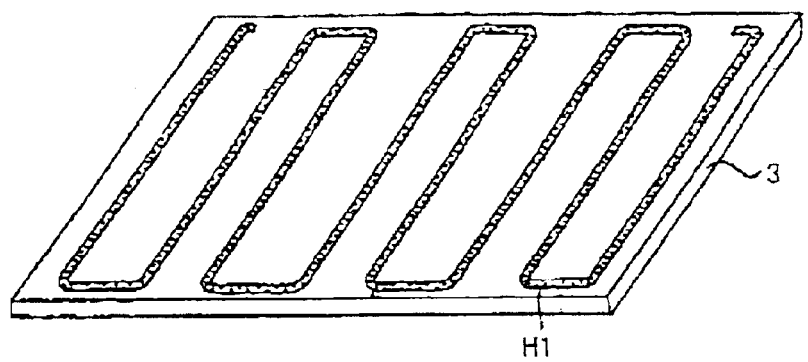
FIG. 2 is an explanatory drawing of a window using a thick-film heater as the heating means.

As shown in FIG. 2, a thick-film heater H1 is formed within the ultraviolet illumination equipment, and specifically is provided on the surface of the dielectric-barrier discharge lamp side of the window 3.

This thick-film heater H1 is a conductive, heat-generating paste that is screen printed onto the window 3, then baked for 30 minutes at 500° C.

Now, the amount of heat produced by this thick-film heater H2 is 1.9 kW.

Heating means 2

Figure 3:
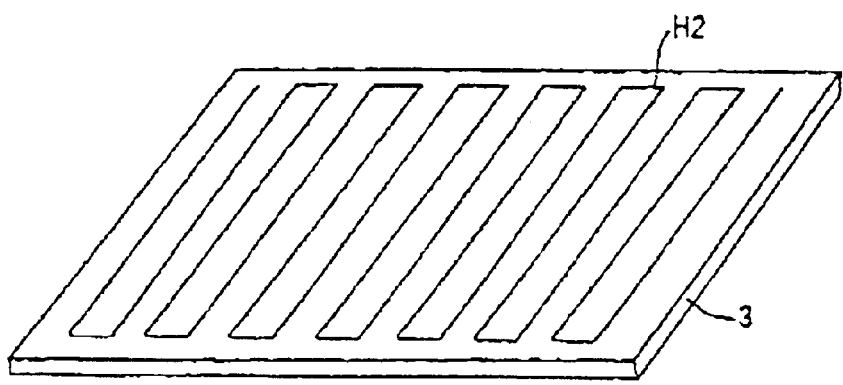
FIG. 3 is an explanatory drawing of a window using a microheater as the heating means.

As shown in FIG. 3, a microheater H2, which is a linear heater, is formed within the ultraviolet illumination equipment, and specifically is provided on the surface of the dielectric-barrier discharge lamp side of the window 3.

This microheater is a fine tube of stainless steel with a nicrome wire running along the center of the tube as a heating element, the space between the tube and the wire being filled with high-grade powdered magnesium. It is a bendable heater.

Now, this microheater H2 is 1.6 mm in diameter and 40 m in length; the amount of heat produced is 4 kW.

The reason that these heating means, H the thick-film heater H1 and the linear heater, H2 are formed within the ultraviolet illumination equipment, and specifically on the surface of the dielectric-barrier discharge lamp side of the window 3 is this: to prevent deterioration of the heaters by preventing direct contact of the heaters with the gases and vapors produced during processing of the item being processed, and to keep the heaters from casting a shadow on points directly below the heaters.

Moreover, by forming the thick-film heater H1 or the linear heater H2 directly on the surface of the window 3, it is possible to heat the window 3 more efficiently.

Heating Means 3

Figure 4:
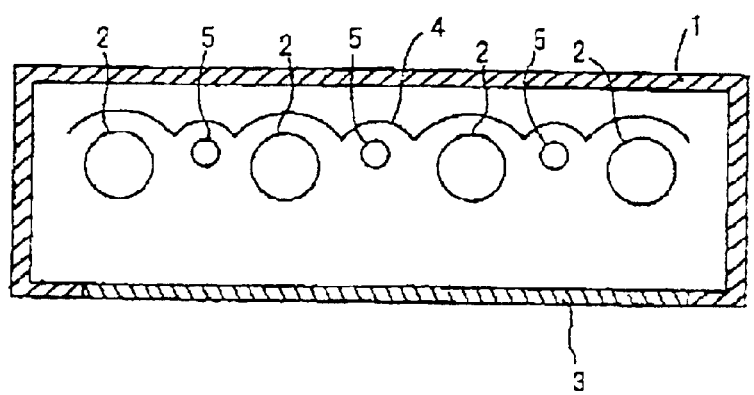
FIG. 4 is an explanatory drawing of a window using incandescent bulbs as the heating means.

As shown in FIG. 4, incandescent halogen bulbs 5 are placed between the dielectric-barrier discharge lamps 2, within the receptacle 1.

In this case, the window 3 is heated by the infrared radiation from the incandescent bulbs 5.

When incandescent bulbs 5 are used as the heating means H in this way, the structure of the ultraviolet illumination equipment is simpler than with thick-film heaters H1 or linear heaters H2, and there is no obstruction at all of ultraviolet radiation passing through the window. Therefore, the uniformity of intensity of the ultraviolet radiation emitted is even better.

Now in this implementation, the incandescent bulbs were 500 W, 25 A halogen lamps sealed on both ends.

Next, experimentation was done to investigate the amount of adhered material relative to the temperature of the window 3 using the ultraviolet illumination equipment shown in FIG. 1 with a thick-film heater on the window, as shown FIG. 2. The results are shown in FIG. 5.

In FIG. 5, the vertical scale shows the window's transparency to light with a wavelength of 172 nm.

As the temperature of the window 3 rose, the transparency increased. From that fact it was known that as the temperature of the window 3 became higher, the reaction products which had adhered to the window 3 began to break up and separate from the window 3. When the window 3 was at 100° C., reaction products that even approached the window were broken up by its radiant heat, and none adhered to the window.

As was learned from these results, heating the window 3 to at least 100° C. made it possible to prevent the reaction products from adhering to the window, to prevent a reduction in the intensity of ultraviolet radiation, and to prevent the formation of debris from reaction products.

As explained above, the ultraviolet illumination equipment of this invention uses a heating means to heat the window 3 to at least 100° C., and so it is possible to prevent the reaction products of organic solvents, acids, alkalis or other chemicals, due to ultraviolet radiation, from adhering to the window 3, and it is possible to prevent the formation of debris from the reaction products.

Moreover, because the heating means is established within the ultraviolet illumination equipment, it does not undergo deterioration from contact with organic solvents, acids, alkalis or other chemicals.

Because the thick-film heaters H1 or linear heaters H2 used as heating means H are formed directly on the surface of the windows 3, the heat generated by these heaters heats the window 3 directly, and so it is possible to heat the window 3 efficiently.

Using incandescent bulbs 5 as the heating means H simplifies manufacturing and further improves the uniformity of ultraviolet radiation intensity, in addition to heating the window 3.

What is claimed is:

1. An ultraviolet illumination equipment comprising:

a receptacle with a window:

a dielectric-barrier discharge lamp located within said receptacle for emitting ultraviolet radiation through said window of said receptacle; and a heating means for preventing formation and accumulation of debris on said window; wherein said heating means is provided within said receptacle; and wherein said heating means is a thick-film heater positioned on a surface of said window.

2. An ultraviolet illumination equipment comprising:

a receptacle with a window;

a dielectric-barrier discharge lamp located within said receptacle for emitting ultraviolet radiation through said window of said receptacle; and a heating means for preventing formation and accumulation of debris on said window; wherein said heating means is provided within said receptacle; and wherein said heating means is a linear heater positioned on a surface of said window.

3. An ultraviolet illumination equipment comprising:

a receptacle with a window;

a dielectric-barrier discharge lamp located within said receptacle for emitting ultraviolet radiation through said window of said receptacle; and a heater to heat said window 3 to at least 100° C.;

wherein said heater is a thick-film heater positioned on a surface of said window.

4. An ultraviolet illumination equipment comprising:

a receptacle with a window;

a dielectric-barrier discharge lamp located within said receptacle for emitting ultraviolet radiation through said window of said receptacle; and a heater to heat said window to at least 100° C.;

wherein said heater is a linear heater positioned on a surface of said window.

* * * * *